United States Patent
Ariyoshi et al.

(10) Patent No.: US 7,258,943 B2
(45) Date of Patent: Aug. 21, 2007

(54) FUEL CELL

(75) Inventors: Toshiaki Ariyoshi, Wako (JP); Masahiko Sato, Wako (JP); Ken Takahashi, Wako (JP); Yuya Sato, Wako (JP); Daisuke Wachi, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 316 days.

(21) Appl. No.: 10/676,060

(22) Filed: Oct. 3, 2003

(65) Prior Publication Data

US 2005/0074655 A1  Apr. 7, 2005

(30) Foreign Application Priority Data

Oct. 3, 2002 (JP) ............................. 2002-291619
Oct. 3, 2002 (JP) ............................. 2002-291620
Oct. 3, 2002 (JP) ............................. 2002-291622

(51) Int. Cl.
*H01M 8/24* (2006.01)

(52) U.S. Cl. .......................................... 429/34; 429/18
(58) Field of Classification Search .................. 429/12, 429/34, 18
See application file for complete search history.

(56) References Cited

U.S. PATENT DOCUMENTS 4,310,605 A * 1/1982 Early et al. .................... 429/18

6,771,041 B2 * 8/2004 Sato et al. ................... 320/101
6,844,093 B2 * 1/2005 Kikuchi et al. ............... 429/23

FOREIGN PATENT DOCUMENTS

| EP | 1 001 666 A2 | 5/2000 |
|---|---|---|
| JP | 09-283166 | 10/1997 |
| JP | 11-273702 | 10/1999 |
| JP | 11339828 | 10/1999 |
| JP | 10-149260 | 12/1999 |
| WO | WO91/19328 | 12/1991 |
| WO | WO99/60644 | 11/1999 |

* cited by examiner

*Primary Examiner*—Mark Ruthkosky
(74) *Attorney, Agent, or Firm*—Lahive & Cockfield, LLP; Anthony A. Laurentano, Esq.

(57) ABSTRACT

A fuel cell of the invention has unified a processing circuit processing a cell voltage output signal of a fuel cell stack and a connector connecting an circuit unit with terminals provided extending from separators of the fuel cell, thereby having abolished connection points (in which harnesses are attached and detached) of an electrical circuit unit with the connector. So, for connection, reliability can be improved, and downsizing is possible. Moreover, with a casing enclosing the connector and electrical circuit unit, the fuel cell can be made compact and the processing circuit can be surely protected thanks to being shielded from surroundings, thereby handling as a unit being able to be facilitated.

1 Claim, 9 Drawing Sheets

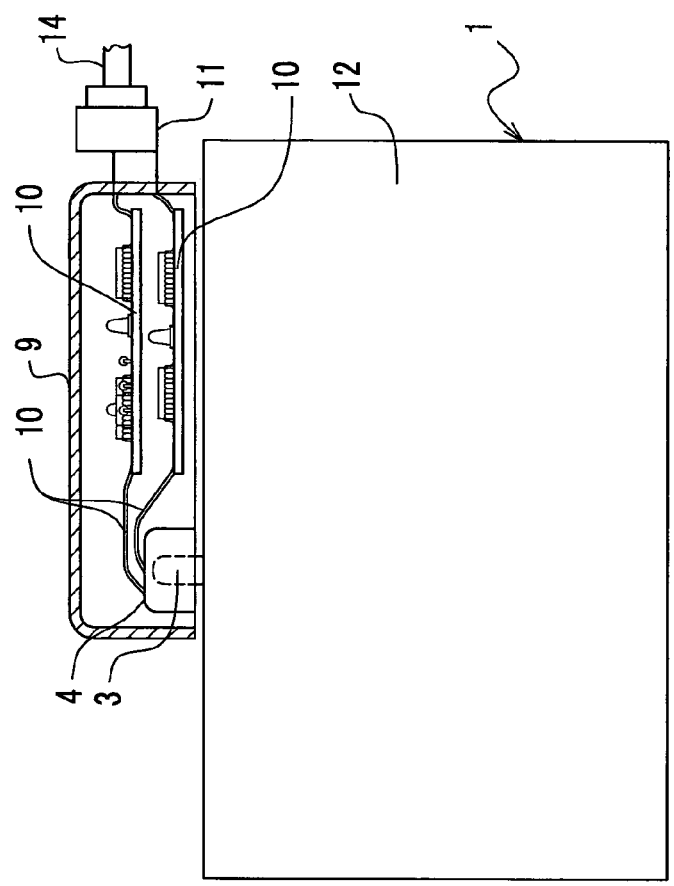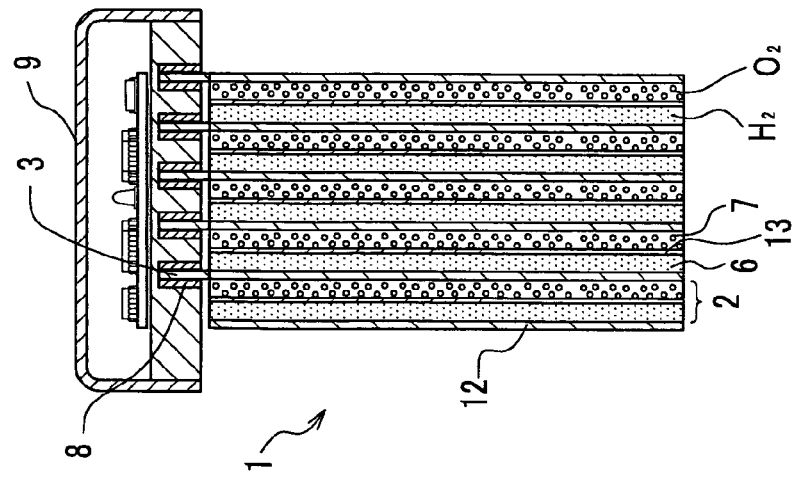

FUEL CELL

FIELD OF THE INVENTION

The present invention relates to a fuel cell, in particular, to a connected structure of terminals used for measuring voltages, connectors connected with the terminals, and circuit boards connected with the connectors.

BACKGROUND OF THE INVENTION

Conventionally, a fuel cell stack composed by stacking a plurality of so-called single cells which hold a membrane electrode assembly (hereinafter abbreviated as MEA) provided face to face with an anode electrode and cathode electrode interlaying a solid polymer electrolytic membrane by pinching/holding with separators made of metal or carbon with good conductivity is known. In a fuel cell in which the fuel cell stack is built in, a fuel cell gas supplied to the anode electrode is ionized on a catalyst electrode and moves to the cathode electrode through a moderately humidified solid polymer electrolytic membrane. Electrons generated during then are taken out into an external circuit and utilized as a direct current. To continuously taking out such an electrical energy, it is necessary for each cell to function favorably.

A voltage between separators composing each cell is measured in operations of the fuel cell to know whether or not the each cell is in a normal condition. For example, in a fuel cell described in pages 3 to 5 and FIGS. 8 and 9 in Japan patent laid open publication 11-339828, the voltage is measured, as shown in FIGS. 1A and 1B, by inserting a connector 127 like a socket into a terminal 119 formed in a separator 111. Meanwhile, the terminal 119 of the fuel cell is connected with a processing circuit which processes a cell voltage. To be more precisely, the terminal 119 is connected with the connector 127, it is connected with the processing circuit via a harness 125 consisting of lead wires, and a number of the harnesses 125 corresponding to those of the terminals 119 are connected.

Meantime, the more the number of separators becomes in a conventional voltage measurement, the more that of connectors to be inserted to each terminal, so there exists a problem that a workability of attaching work of these connectors becomes worse. For the problem, although unifying a plurality of connectors is thought of to simplify the attaching work of these connectors, there exists another problem that a workability of attaching work of these connectors becomes worse in case of unifying a plurality of connectors due to a total weight increase of the module. Moreover for the problem, although dividing the unified module into several modules and attaching them to one piece made of each cluster of terminals is thought of, it is necessary to broaden a distance between separators considering thickness of neighboring modules, thereby causing still another problem that a size of a fuel cell totally becomes larger.

Moreover, in the fuel cell with a module or modules described above, if separators are displaced along their stacked direction due to such as a separator thermal expansion deriving from an impact, vibration, and/or rapid temperature change, positions of modules attached as an outer covering and those of separators are relatively misaligned. Such the position misalignment causes breakages of terminals and/or connectors and poor connections of terminals with connectors. Accordingly, connector positions need to be adjusted corresponding to the misalignment.

Furthermore, between the connectors connected with the terminals and circuit boards consisting of the processing circuit, a harness consisting of lead wires and the like connects, and a number of harnesses corresponding to that of cells or terminals are provided, thereby there existing a problem that a connected structure by the harnesses in itself is low in its reliability. In addition, many lead wires are provided as the harnesses between the connectors and circuit boards, so there exists another problem that handling is not easy.

SUMMARY OF THE INVENTION

An exemplary object of the present invention, which is discovered to solve the above mentioned problems, is to provide a fuel cell having a connected structure which is high in reliability, easy to handle, and compact. Another exemplary object of the invention is to provide a fuel cell which can contribute to a workability of connecting connectors becoming favorable and the fuel cell becoming compact. Still another exemplary object of the invention is to provide a fuel cell, which can avoid breakages of terminals and/or connectors and poor connections of terminals with connectors and has a connected structure of terminals and connectors with good conductivity.

The invention which has solved the conventional problems described above is characterized in that a fuel cell has processing circuits processing a voltage output signal of each cell composing a fuel cell stack, connectors connecting the processing circuits with terminals provided extending from separators composing the each cell, and a casing enclosing the processing circuits and connectors.

The fuel cell of the invention has unified the processing circuits processing cell voltage output signals (output levels) of the fuel cell stack and the connectors connecting the processing circuits with the terminals provided extending from the separators of the fuel cell, thereby having abolished connection points (in which the harnesses are attached/detached) of the processing circuits with the connectors. So, for connection, reliability can be improved and downsizing is possible. Moreover, with the casing enclosing the connectors and processing circuits, the fuel cell can be made compact and the processing circuits can be surely protected thanks to being shielded from surroundings and handling as a unit can be facilitated.

Another fuel cell of the invention, in which a plurality of separators are stacked and terminals extending from one end of each separator are equipped, is characterized in that terminals provided with a plurality of the separators are separated into a plurality of terminal clusters; the terminal clusters are alternately provided at one side and the other side of the one end; and a plurality of connector modules formed in a same shape which have each connector portion with a unified connector connected with each terminal of the one terminal cluster and each main body portion formed in a smaller width than the connector portion are provided to be reversely directed each other at the one end.

The above another fuel cell enables a workability of connecting connectors to be favorable because it suffices to connect a connector module, corresponding to each cluster of terminals in size, with the each cluster of terminals. Moreover, the connector modules are reversely provided in direction each other, thereby connector portions, which are formed as enclosing each terminal, being alternately provided at one side and the other side of the one end, so the connectors do not interfere with each other. In addition, main body portions do not also interfere with each other because they are formed narrower in width than the connector portions. Therefore, it is unnecessary to broaden a distance between separators in order to prevent the interference, thereby the fuel cell being able to be totally made compact. Moreover, the connector modules can be formed as a same shape, so parts can be made common, thereby cost being able to be lowered. Each terminal is provided at one end of each separator, so the connector module can be inserted from the one end only, thereby its access being able to be facilitated.

Still another fuel cell of the invention is characterized by equipping the fuel cell with fuel cell stacks, in which a cluster of cells stacked with a plurality of cells parallel arrayed in a stacked direction; a sheet form body inserted between each cluster of cells; terminals extending from one end of separators composing the cluster of cells; and connector components having connectors connected with the terminals, wherein the connector components are fixed on the sheet form body.

In the still another fuel cell, if the separators are displaced along their stacked direction due to such as a separator thermal expansion deriving from an impact, vibration, and/or rapid temperature change, the sheet form body which is inserted between the each cluster of cells also concurrently is displaced toward the same direction as the separators. Thus, the connector components fixed on the sheet form body also are displaced same as it, so the connectors of the connector components and the terminals extending from the separators concurrently are displaced in a same direction.

According to the fuel cell, if the separators are displaced in the stacked direction of the fuel cell, positions of the connectors and terminals do not be misaligned each other because they concurrently are displaced in the same direction. Accordingly, the fuel cell does not cause breakages of terminals and/or connectors and poor connections of terminals with connectors due to a separator displacement.

BRIEF DESCRIPTION OF THE DRAWINGS

FIGS. 3A and 3B are drawings schematically showing the fuel cell related to the first embodiment: FIG. 3A is a section drawing of FIG. 2 through an arrow view A; and FIG. 3B is a partial section drawing of FIG. 2 through an arrow view B.

DESCRIPTION OF THE PREFERRED EMBODIMENTS a. First Embodiment of the Invention

Figure 1B:
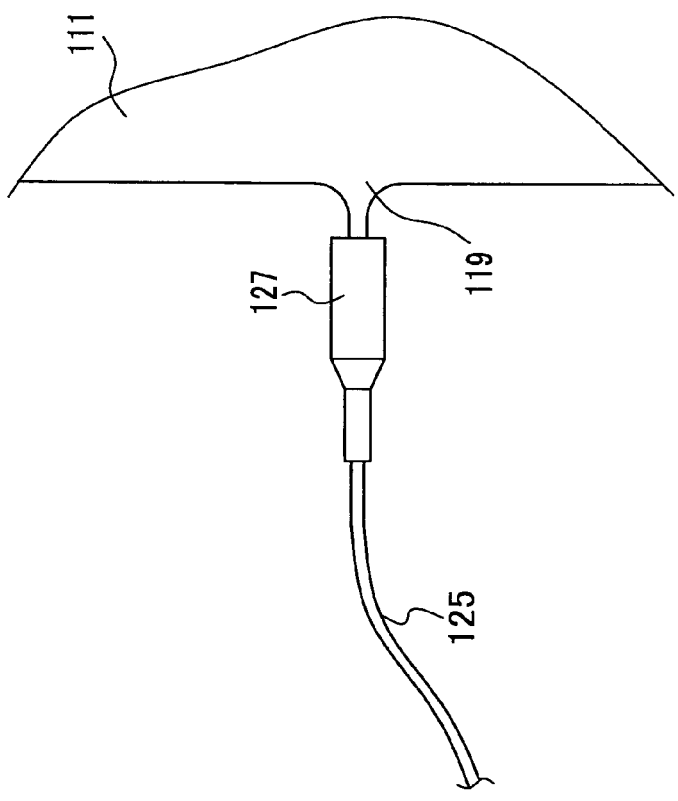
FIGS. 1A and 1B are schematic drawings showing connected structures of cell terminals and connectors thereof connected with the terminals in a conventional fuel cell.
Figure 1A:
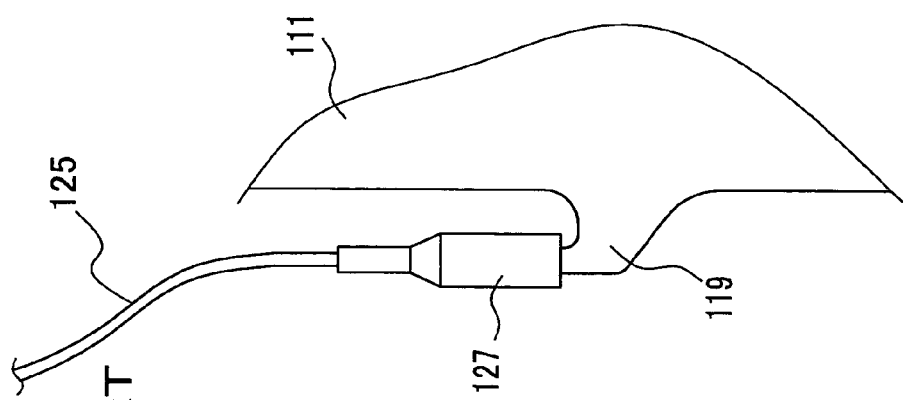
Figure 2:
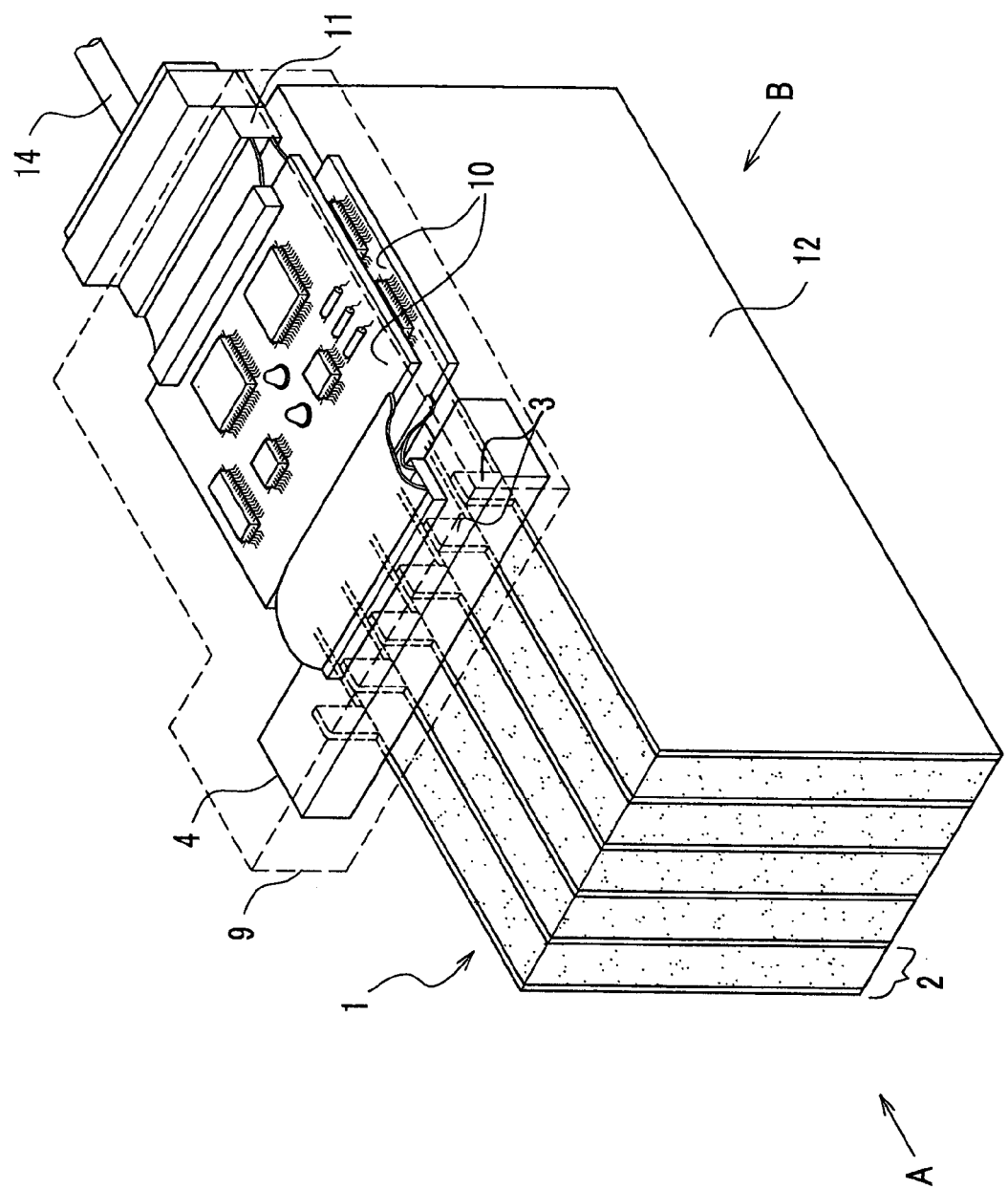
FIG. 2 is a perspective view schematically showing a fuel cell related to a first embodiment.

A first embodiment of a fuel cell related to the present invention is described referring to drawings. FIG. 2 is a perspective view schematically showing the fuel cell related to the first embodiment. As shown in FIG. 2, a fuel cell 1 is composed of a plurality of single cells 2 by stacking and is equipped with terminals 3 which are provided extending from separators 12 to lead voltages generated from the single cells 2. The terminals 3 are connected with a connector 4. The connector 4 is formed as one with circuit boards 10 consisting of a processing circuit which monitors/processes cell voltages (output levels) of the single cells 2. An electrical signal output from the circuit boards 10 are led to a control unit not shown in the drawing via a harness connector 11 and harness 14. Moreover, the connector 4 and circuit boards 10 are covered with a casing and formed as a compact box form, thereby being shielded and protected from surroundings.

FIGS. 3A and 3B are schematic drawings showing a fuel cell related to a first embodiment; FIG. 3A is a section drawing of FIG. 2 through an arrow view A; and FIG. 3B is a partial section drawing of FIG. 2 through an arrow view B. As shown in FIGS. 3A and 3B, the processing circuit monitoring/processing cell voltages of the fuel cell 1 is connected with the terminals 3 in order to efficiently utilize the fuel cell 1. Although detailed description is omitted, the single cells 2 of the fuel cell 1 hold electrolytic membranes 13 between anode electrodes 6 and cathode electrodes 7 and the cell voltages generated by the single cells 2 of the fuel cell 1 are utilized for various usages such as a fuel cell automobile.

The cell voltages are generated by hydrogen, which is a fuel, being supplied to the anode electrodes 6 and an oxidizer such as air being supplied to the cathode electrodes 7 in the single cells 2 composing the fuel cell 1. The generated cell voltages are taken out as voltages from the terminals 3 provided extending from the separators 12.

Thus, the cell voltages generated in the single cells 2 are led out from the terminals 3. They are connected with connector contactors 8 of the connector 4 and are connected with at least one circuit board 10 which is unifiedly provided with the connector 4.

Figure 4:
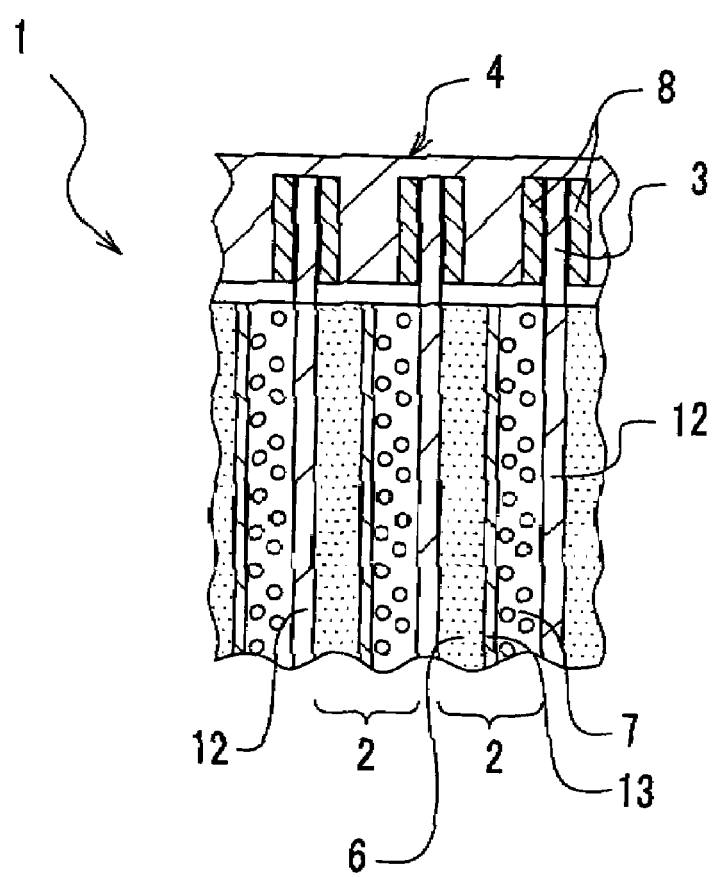
FIG. 4 is a section drawing illustrating a situation in which a cell voltage is generated.

Then, operations of the fuel cell 1 composed as above are described. FIG. 4 is a section drawing illustrating a generation of the cell voltages in the single cells 2 composing the fuel cell 1. In the fuel cell 1 of FIG. 4, the hydrogen which is the fuel is humidified and supplied to the anode electrodes 6, and there, the hydrogen is dissociated into electrons and protons. The dissociated electrons move to the anode electrodes 6 via a load not shown in the drawing, a current flows, and a voltage level difference is generated, thereby the cell voltages being able to be obtained. On the other hand, the protons move to the cathode electrodes 7 in the electrolytic membranes and oxidized by an oxidizing gas such as air, thereby producing water.

The cell voltages generated in the single cells 2 are detected by the terminals 3 provided extending from the separators 12. The terminals 3 contact the connector contactors 8 of the connector 4 and are connected with at least one circuit board 10 (see FIG. 3) which is unifiedly provided with the connector 4. The cell voltages detected by the terminals 3 are processed into electric signals by the processing circuit provided on the circuit boards 10.

The connector 4 for the terminals 3 provided extending from the separators 12 are provided on an upper surface of the fuel cell 1, thereby being connected with the circuit boards 10 composing the processing circuit (see FIG. 3). The circuit boards 10 consisting of the processing circuit has, for example, two pieces of the terminals 13: one piece is connected on an upper side for monitoring the cell voltages and the other connected on an lower side as an open circuit voltage (OCV) reducing board, thus being provided on the upper and lower sides in a vertical direction, thereby the boards 10 becoming a flat-space saving unit.

As described above, the connector 4 connected with the terminals 3 and circuit boards 10 are composed as one unit and the unit consisting of the connector 4 and circuit boards 10 are enclosed by the casing 9, thereby the cell voltages being monitored/processed.

The present invention heightens reliability of the fuel cell 1 and downsizes it omitting wire connections by making a structure in which the connector 4 of the terminals 3, a monitor of the cell voltages, and the circuit boards 10 electrically processing the OCV reducing circuit are directly connected as one.

Moreover, because the processing circuit processing the output signals (output levels) of cell voltages of the fuel cell 1 and the connector 4 connecting the processing circuit with the terminals 3 provided extending from the separators 12 of the fuel cell 1 are unified, a reliability of connection points can be improved and the fuel cell 1 can be downsized. In addition, the connector 4 and the circuit boards 10 of the processing circuit are enclosed with the casing 9, thereby the fuel cell 1 being able to be made compact, so the processing circuit can be surely protected thanks to being shielded from surroundings and handling can be facilitated thanks to a unitization.

Although the preferred embodiment is described as above, the present invention is not limited to the embodiment and it is changeable as needed as far as ideas are not deviated from those of the invention. In the embodiment, for example, although the fuel cell in which two circuit boards and a connector are unified, a unification of the connector and circuit boards more than two is also available. Off course, a unification with one circuit board is also available.

b. Second Embodiment of the Invention

Then, a second embodiment of a fuel cell related to the present invention is described referring to drawings.

Figure 5:
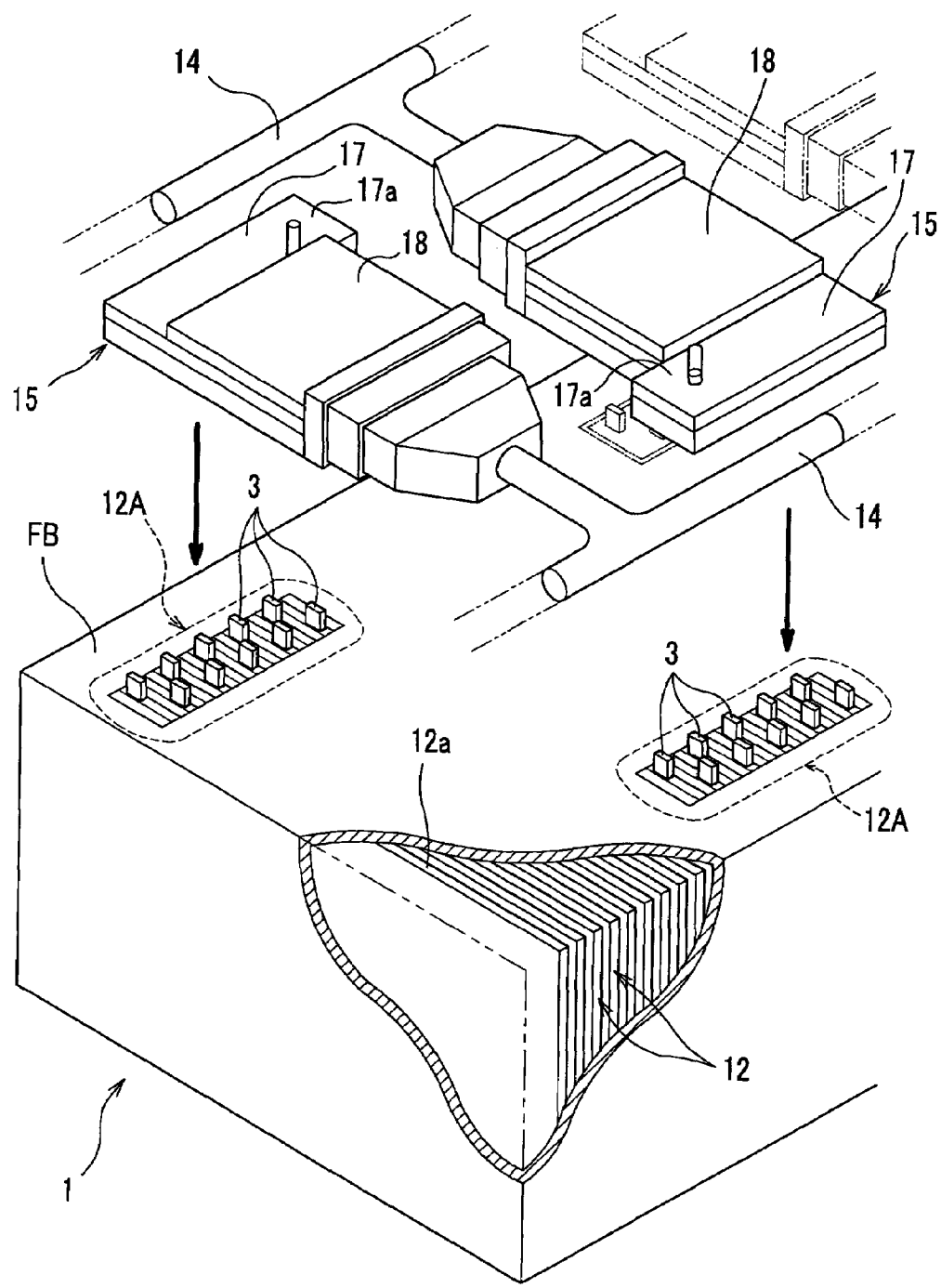
FIG. 5 is a perspective view with a partial cutaway showing a fuel cell related to a second embodiment.
Figure 6:
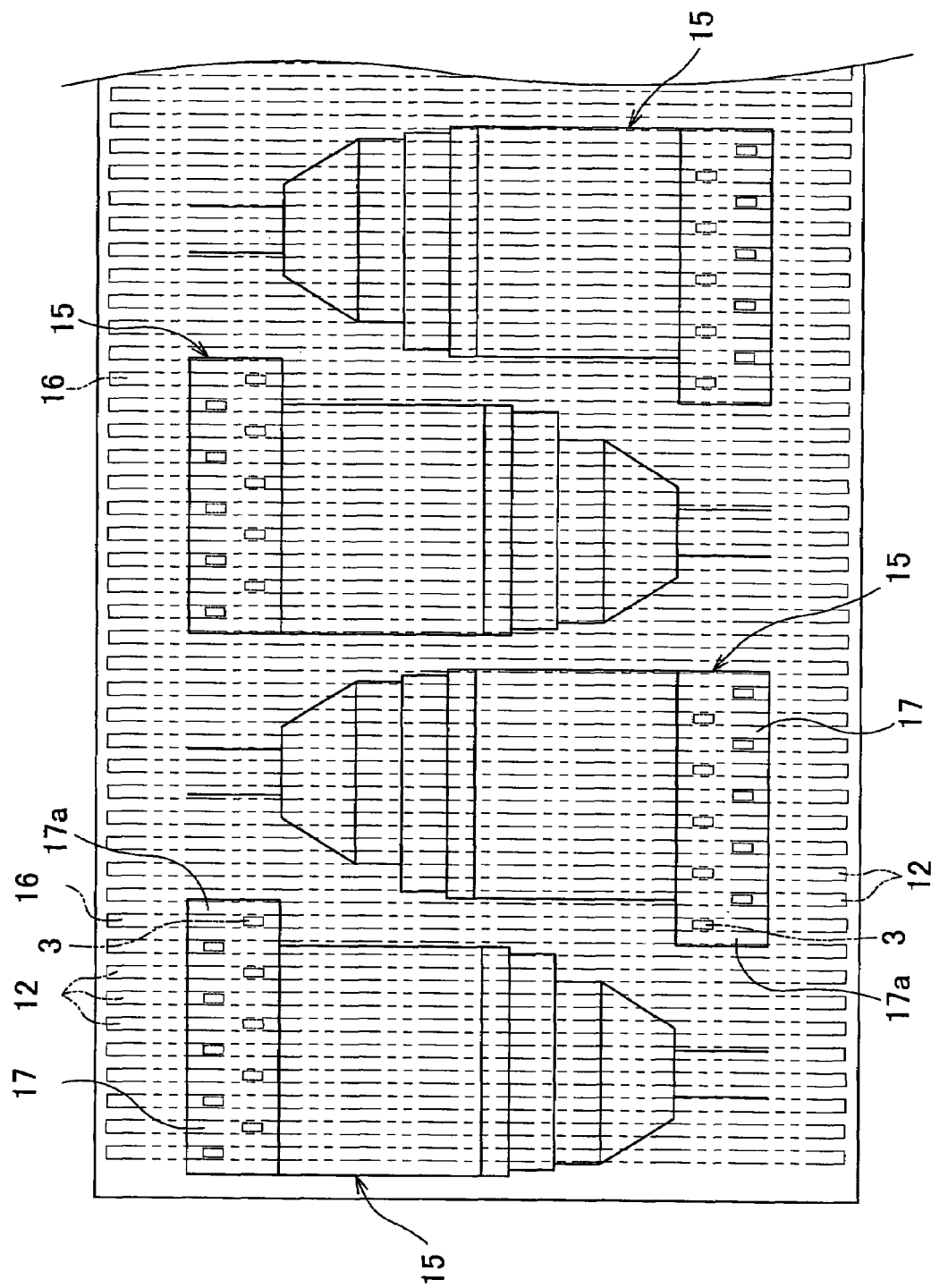
FIG. 6 is a plan view showing an arrangement of connector modules attached to the fuel cell of FIG. 2.

For referred drawings, FIG. 5 is a perspective view with a partial cutaway and shows the fuel cell related to the second embodiment. FIG. 6 is a plan view showing an arrangement of connector modules attached to the fuel cell of FIG. 2.

As shown in FIG. 5, the fuel cell 1 is composed so that membrane electrode assemblies not shown in the drawing are plurally stacked being pinched/held by the separators 12 and the assemblies are housed in a fuel box FB. Moreover, the fuel cell 1 is equipped with connector modules 15 to measure voltages between neighboring separators 12.

The terminals 3 which are extending upward (outside) are formed on an upper surface 12a (one end) of the separators 12. A plurality of terminals 3 formed in a plurality of separators 12 are separated into a plurality of terminal clusters 12A as a cluster consisting of a predetermined number of the terminals 3 with the separators 12 being stacked. The terminal cluster 12A is alternately provided at one side and the other side of upper surface 12a of the separator 12. In addition, the terminal 3 composing the terminal clusters 12A are provided, with neighboring terminals being alternately displaced at an outside and inside. Moreover, in separators 16 (see FIG. 6) provided at a predetermined position out of plurality of the separators 12, a pair of terminals 3 which extend upward are formed on both ends of upper surface of the separators 16.

Connector modules 15 have connector portions 17 which are unified with connected connectors (not shown in the drawing) with each terminal 3 of the terminal clusters 12A and main body portions 18 formed narrower in width than the connector portions 17. To be more precise, parts of the connector portions 17 (protrusion portions 17a) are formed so as to protrude from one side of the main body portions 18, thereby the connector modules 15 being totally like an approximate L shape in a plan view. Moreover, in the body portions 18, circuit boards (not shown in any drawing) to measure a voltage between each separator detected from each connector of the connector portions 17 are provided and the voltages measured by the circuit boards are output in an indication unit indicating the voltages, an electrical control unit (usually abbreviated as ECU and not shown in any drawing), and the like through a harness 14. A number of the connector modules formed as above is provided corresponding to that of the terminal clusters 12A so that a same shape of the connector modules 15 is reversely directed each other in a plane formed by the upper surface 12a of each separator 12. Here, the connector modules 15 mean structure bodies composed by assembling the connectors 4, circuit boards 10, casing 9, and the like described in the first embodiment.

To describe in more detail, as shown in FIG. 5, the connector modules 15 are provided so that the protrusion portions 17a and those of neighboring connector modules 15 are reversely directed each other in a stacked direction of the separators 12. In other words, out of a plurality of the connector modules 15, the protrusion portions 17a of the connector modules 15 and those of the neighboring connector modules 15 which are in a same line of longitudinal direction of the separators 12 are made a pair, and a plurality of pairs are provided in the stacked direction of the separators 12. Then, one pair of connector modules 15 and a corresponding pair of protrusion portions 17a are provided on the upper surface of the separators 16, and connectors which are provided inside them are connected with two terminals 3 formed at both ends. In other words, the separators 16 are provided at positions in which the protrusion portions 17a in a same line of longitudinal direction of the separators 12. Moreover, the pair of connector modules 15 are approximately formed in their size not to interfere with one protrusion portion 17a and the other main body 18 when the modules are connected with respective terminal clusters 12A.

Here, a reason why two terminals 3 are provided at the separators 16 in the embodiment is to measure each voltage between the separators 16 and both neighboring separators 12. That is, if one of the two terminals 3 is entered in one terminal cluster 12A and the other terminal into the other terminal cluster 12A, each voltage between the separator 16 and both neighboring separators 12 results in being measured by each circuit board of respective two connector modules 15.

According to the above, in the embodiment, effects described below can be obtained.

1. Because it suffices to connect the connector module 15 with a size corresponding to each cluster of the terminals 12A, a workability of connecting connectors can be made favorable.

2. Each neighboring module 15 is reversely provided in a direction each other, whereby no interference between each connector portion 17 formed to enclose each terminal 3 occurs, and also no interference between each main body portion 18 formed narrower in width than the connector portion 17 occurs. Therefore, a distance between the separators 12 need not be broadened to prevent the interference, thereby the fuel cell 1 being able to be totally made compact.

3. The connector modules 15 can be formed as a same shape, so parts can be made common, thereby cost being able to be lowered.

4. Each terminal 3 is provided on the upper surface 12a of each of the separators 12 and 16, so the connector modules 15 can be inserted from one end only, thereby their accesses being able to be facilitated.
5. Each terminal 3 is provided alternately displaced, whereby an electrical short cut between each neighboring terminal 3 can be surely prevented and thickness of each connector connected with each terminal 3 can also be sufficiently kept.

However, the present invention is practiced in various forms without being limited to the second embodiment.

In the embodiment, although each voltage between the separators 12 is adapted to be measured by the circuit board provided in the main body portion 18 of each connector module 15, the invention is not limited to this. For example, without providing the circuit board in the main body portion 18, it is also available to connect each connector of plurality of the connector modules 15 with one voltage measurement unit through the harness 14 and to measure the each voltage with the voltage measurement unit at a same time. The case measures the each voltage with the voltage measurement unit in which a voltage potential of each separator is input at a same time, so it is unnecessary to provide the separators 16 provided in a same line of longitudinal direction of the protrusion portions 17a with two terminals 3. Therefore, it suffices to prepare only two types of separators as the separators 12, one type with the terminal 3 outside and the other with the terminal 3 inside, so manufacturing cost thereof can be lowered.

In the embodiment, although the connector modules 15 are formed to be like the approximate L shape in its plan view, the invention is not limited to this and any shape is available if the main body portions 18 are formed narrower in width than the connector portions 17. For example, with forming the connector portions 17 so as to protrude from both sides of the main body portions 18, to totally make the shape of the connector modules 15 like the approximate L shape in its plan view is also available. In this case, however, it is preferable to make the connector modules 15 provided at both sides of the fuel cell 1 an L shape from point of downsizing, so the connector modules like the L shape are provided at the both sides and those like a T shape are provided inbetween them. In this case, because two kinds of the connector modules 15 of the L and T shapes have to be prepared, it is preferable to only compose the connector modules of the L shape in order to lower manufacturing cost.

Meanwhile, it goes without saying that such as a number of stacked sheets of the separators 12, terminal clusters 12A, and terminals 3 composing the terminal cluster 12A, and material of the connector modules 15 are changeable as needed.

c. Third Embodiment

Then, a third embodiment of a fuel cell related to the present invention is described referring to drawings.

Figure 7:
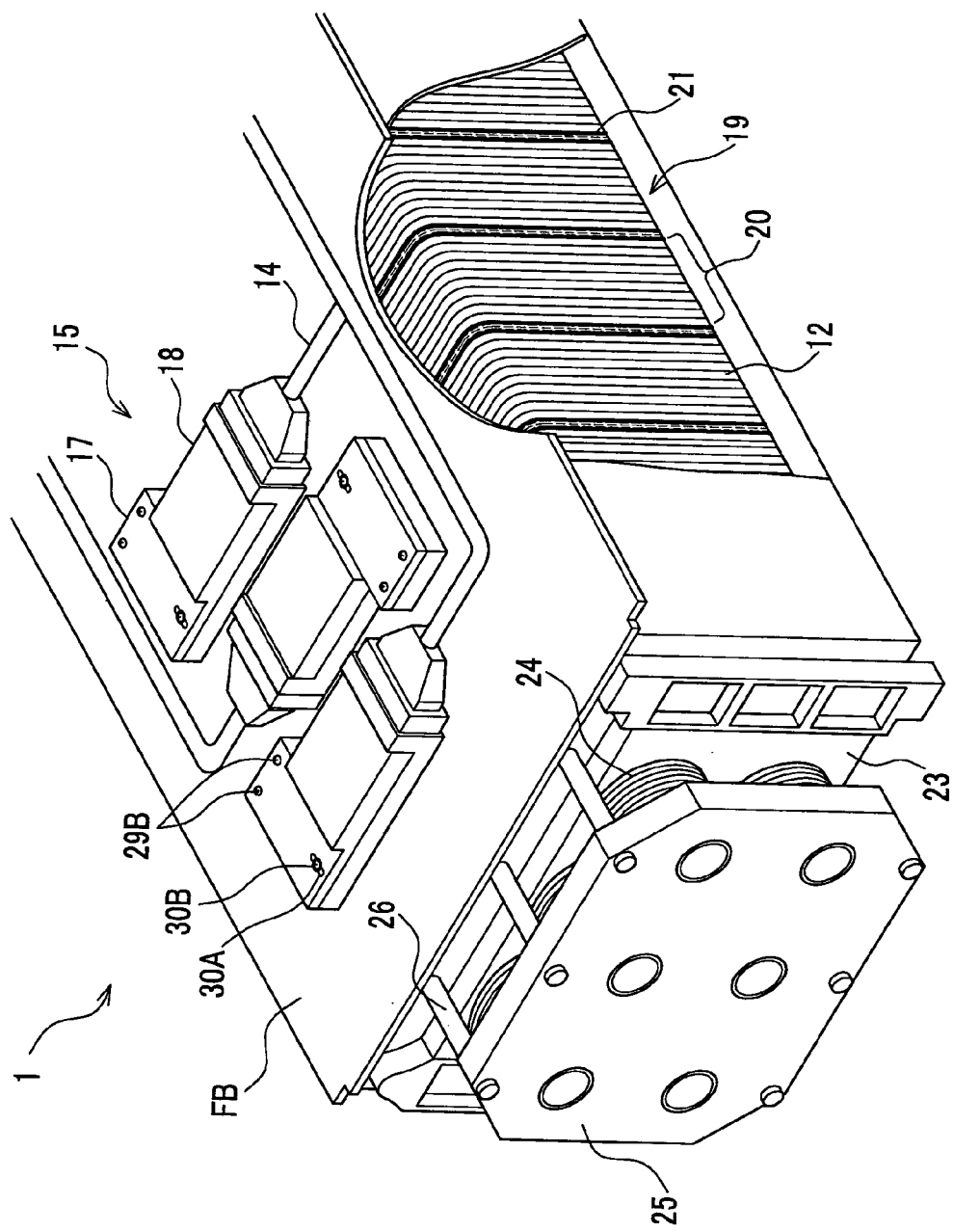
FIG. 7 is a perspective view with a partial cutaway showing a fuel cell related to a third embodiment.
Figure 8:
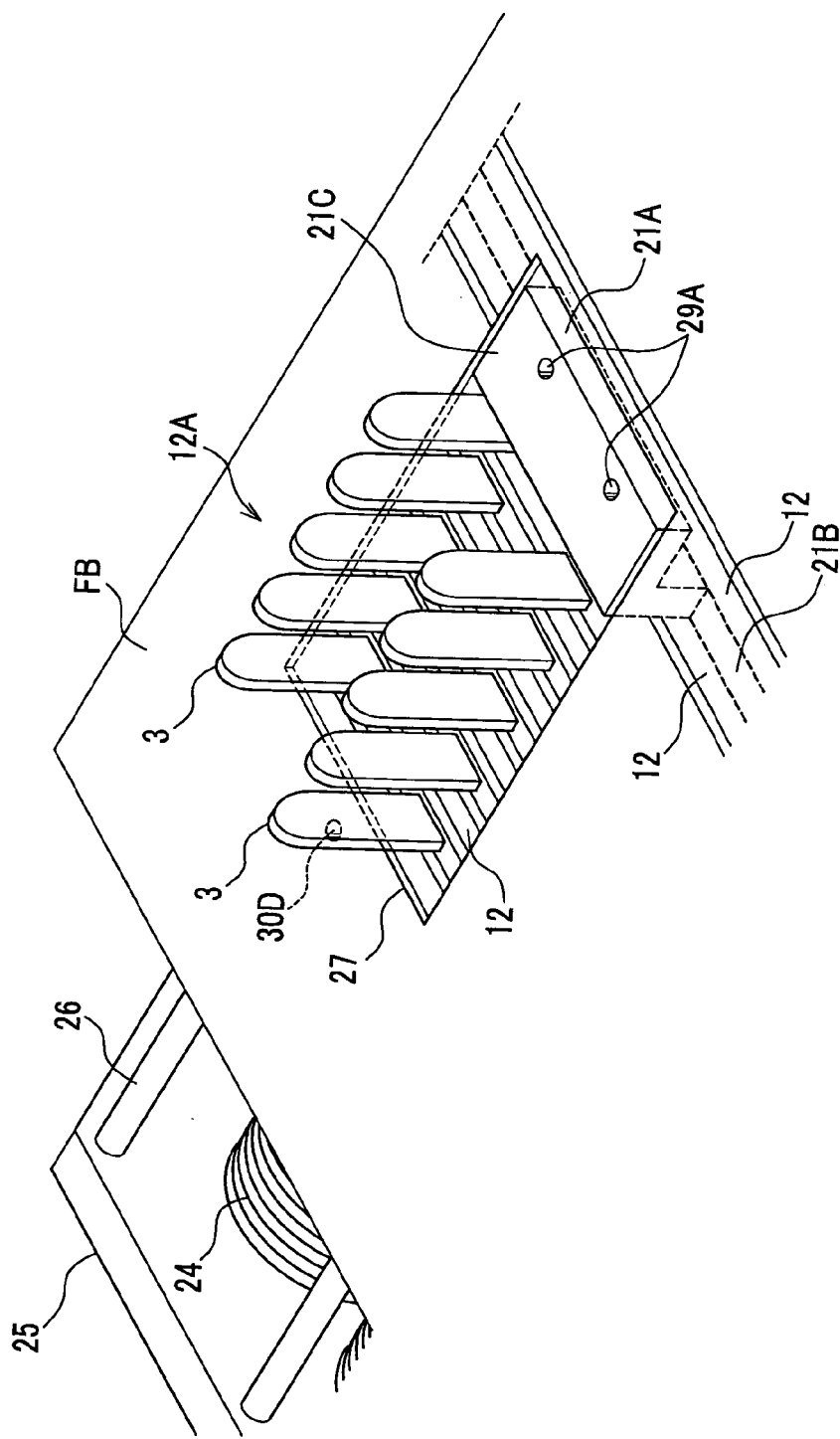
FIG. 8 is a partially enlarged perspective view around terminals.
Figure 9:
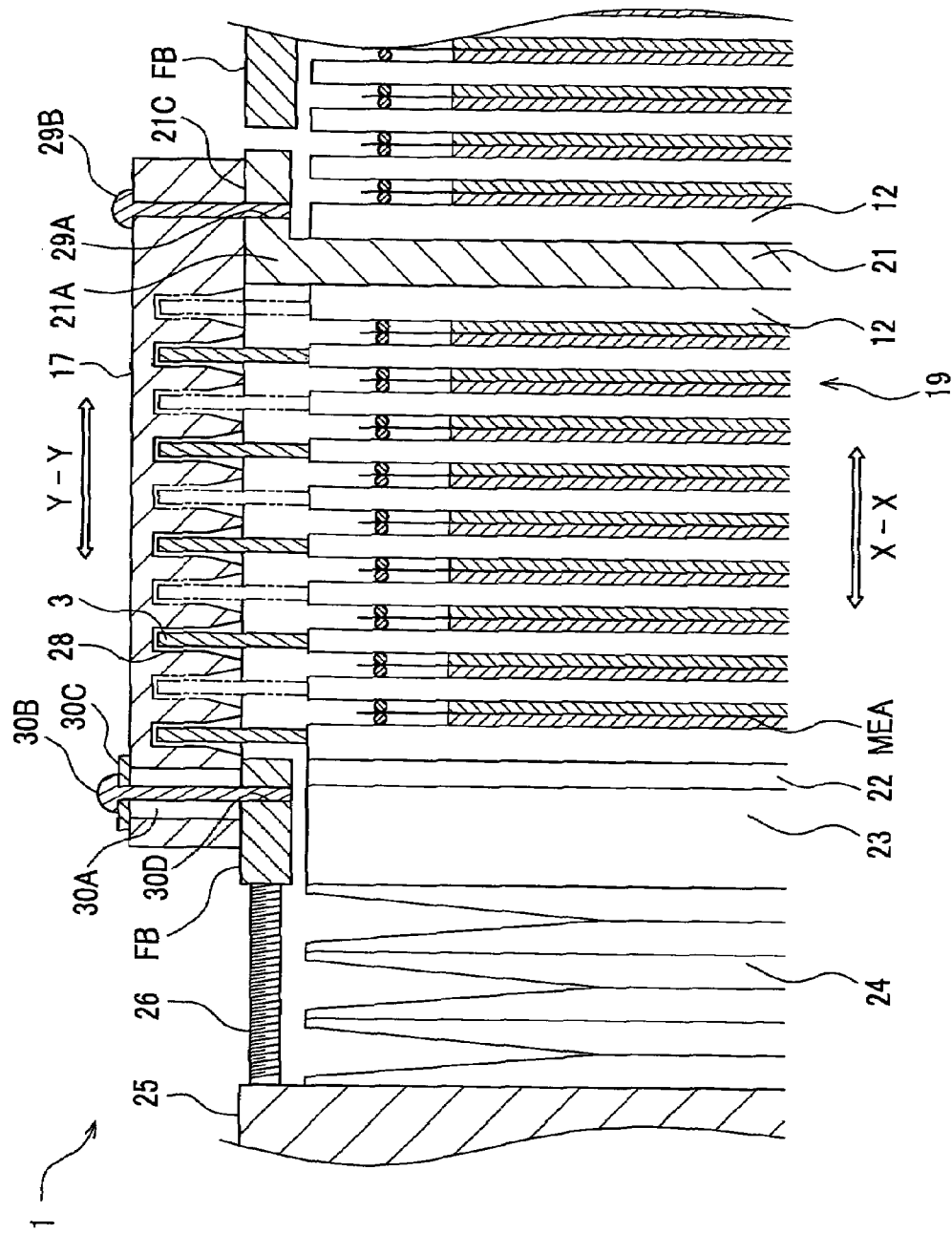
FIG. 9 is a partially enlarged perspective view of a fuel cell.

For referred drawings, FIG. 7 is a perspective view with a partial cut away showing the fuel cell related to the invention. FIG. 8 is a partially enlarged perspective view around terminals. FIG. 9 is a partial section drawing of the fuel cell.

As shown in FIGS. 7 and 9, a fuel cell stack 19 is housed in the fuel cell box FB. The fuel cell stack 19 is equipped with a cell cluster 20 in which a plurality of the separators 12 pinching/holding the MEA and a movable separating plate 21 (stopper) described later is inserted between each cell cluster 20. On one side of the fuel cell stack 19, an end plate, disc spring 24, and backup plate 25 are arranged through an insulator 22 and on the other side without the disc spring, not shown in the drawings, an insulator, end plate, and backup plate are arranged in this order like the one side. Then, the both backup plates are fastened with a through-bolt 26, thereby each layer composing the fuel cell stack 19 is connected each other. The insulator 22 electrically insulates the fuel cell stack 19 and end plate 23. When the fuel cell stack 19 shrinks toward a stacked direction, the disc spring 24 absorbs the shrinkage.

In the separators 12, as shown in FIG. 8, the terminals 3 extend upward from their upper ends. A plurality of the terminals 3 formed at a plurality of the separators 12, which are in a stacked state, are separated into a plurality of terminal clusters 12A in which a predetermined number of the terminals 3 are made one piece. The terminals 3 composing the terminal clusters 12A form two columns in which the terminals extending each other from the neighboring separators 12 are alternately displaced at a predetermined distance. The terminal clusters 12A protrude outside the fuel cell box FB through a rectangular opening 27 formed on its upper side.

The fuel cell 1 is connected with terminal clusters 12A, and furthermore equipped with the connector modules 15 described below to measure voltages between the neighboring separators 12.

Here as obvious by again seeing FIG. 7, the connector modules 15 have the connector portions 17 (connector components) with connectors 28 (see FIG. 9) connected with each terminal of the terminal clusters 12A as one and the main body portions 18 formed narrower in width than the connector portions 17.

Within the main body portions 18, circuit boards (not shown in the drawings), which measure voltages between each separator 12 detected from each connector 28 of the connector portions 17, are provided. The voltages measured with the circuit boards are output in the electrical control unit (not shown in the drawings) to control them through the harness 14.

The fuel cell 1 is furthermore equipped with a connector position adjustment mechanism. The adjustment mechanism is composed of the movable separating plates 21 and connector modules 15.

The separating plates 21 which are sheet forms are, for example, composed of material with conductivity and rigidity such as a stainless steel. As shown in FIG. 9, the separating plate 21 is pinched/held by a pair of the separators 12 and is equipped with a protrusion piece 21A which protrudes upward from the fuel cell stack 19. As obvious by again seeing FIG. 8, the cell stack 19 horizontally bends at a top end extending upward from a movable separating main body 21B and further extends, thereby being equipped with a horizontal surface 21C which is at a same level with the upper surface of the fuel cell box FB.

The protrusion piece 21A is arranged to be able to change a position along a stacked direction of the fuel cell stack 19 so that a top end horizontal portion of the protrusion piece 21A keeps a predetermined distance from an edge of opening 27 of the fuel cell box FB. At a horizontal portion of the protrusion piece 21A, a screw hole 29A is formed to fix the connector module 15. It is fixed on the protrusion piece 21A with a screw 29B with which one end of the connector portion 17 is screwed in the screw hole 29A (see FIG. 7). Thus, the connector portion 17 is fixed on the protrusion piece 21A and the connector 28 results in being connected with the terminals 3.

On the other hand, at the other end of the connector portion 17, as shown in FIGS. 7 and 9, a screw through-hole 30A of which section shape is an elongated one is formed in the stacked direction of the fuel cell stacks 19. Then, the other end of the connector portion 17 is attached to the fuel cell box FB by a screw 30B with a washer 30C, which is screwed in a screw hole 30D (see FIG. 8) formed in the fuel cell box FB, through the screw through-hole 30A. Thus, the other end of the connector portion 17 attached to the fuel cell box FB is adapted to be slidable on the upper surface of the box FB.

Then, movements of the connector position adjustment mechanism are described. In the fuel cell 1, if the separators 12 are displaced along their stacked direction (X-X direction) due to their thermal expansion deriving from an impact, vibration, and/or rapid temperature change (see FIG. 9), the movable separating plates 21 which are pinched/held by the separators 12 also concurrently are displaced in a same direction. On the other hand, one ends of the connector portions 17 are fixed on the separating plates 21 and, as described above, the other ends are adapted to be slidable on the upper surface of the fuel cell box FB. Thus, the connector portions 17 also are displaced same as the separating plates 21. Accordingly, the connectors 28 of the connector portions 17 and the terminals 3 extending from the separators 12 concurrently are displaced in a same direction of Y-Y directions (see FIG. 9).

According to the fuel cell 1 related to the embodiment, if the separators 12 are displaced in the stacked direction of the fuel cell stacks 19, positions of the connectors 28 and those of the terminals 3 do not misalign each other because they concurrently are displaced in a same direction thanks to the connector position adjustment mechanism. Accordingly, the fuel cell 1 does not cause breakages of the terminals 3 and connectors 28 and poor connections between the terminals 3 and connectors 28 due to displacements of the separators 12.

However, the present invention is practiced in various forms without being limited to the third embodiment.

In the embodiment, although the separators 12 and movable separating plates 21 are composed of different components, it is also available to build a structure of the separators 12 in the separating plates 21 so that the separating plates 21 double with the separators 12, and to remove the separators 12 which pinch/hold the separating plates 21.

Moreover in the embodiment, although the other ends of the connector portions 17 are attached to the fuel cell box FB with the screws 30B, it is unnecessary to attach the other ends to the box FB if one ends of the connector portions 17 are solidly fixed on the movable separating plates 21.

What is claimed is:

1. A fuel cell comprising:
   a plurality of cells;
   a plurality of separators, wherein two adjacent separators sandwich one of the plurality of cells, and each of the plurality of separators has a terminal protruding from one end of the corresponding separator, the plurality of separators are stacked such that all the terminals are on a same side of a fuel cell stack and protruding from the same side of the fuel cell stack;
   a fuel box enclosing the plurality of cells and the plurality of separators, the fuel box includes one or more openings to allow the terminals from the plurality of separators to protrude outside the fuel box;
   a processing circuit outside of the fuel box processing an electrical output signal of each of the plurality of cells composing the fuel cell stack;
   a connector outside of the fuel box connecting said processing circuit with the plurality of terminals from the plurality of separators, wherein the connector includes a plurality of slots enclosing the terminals; and
   a casing enclosing said processing circuit and said connector.

* * * * *